(12) United States Patent
Lee et al.

(10) Patent No.: US 12,424,271 B2
(45) Date of Patent: Sep. 23, 2025

(54) SEMICONDUCTOR APPARATUS AND SEMICONDUCTOR SYSTEM HAVING LUN SELECTION CYCLE, AND OPERATING METHOD OF SEMICONDUCTOR SYSTEM

(71) Applicant: SK hynix Inc., Icheon-si (KR)

(72) Inventors: Jae Young Lee, Icheon-si (KR); Won Sun Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 242 days.

(21) Appl. No.: 18/297,375

(22) Filed: Apr. 7, 2023

(65) Prior Publication Data

US 2023/0326517 A1    Oct. 12, 2023

Related U.S. Application Data

(60) Provisional application No. 63/328,521, filed on Apr. 7, 2022.

(30) Foreign Application Priority Data

Mar. 9, 2023    (KR) .......................... 10-2023-0031254

(51) Int. Cl.
*G06F 12/02*      (2006.01)
*G06F 13/20*      (2006.01)
*G11C 7/10*       (2006.01)
*G11C 11/4093*    (2006.01)
*G11C 11/4096*    (2006.01)

(52) U.S. Cl.
CPC .......... *G11C 11/4096* (2013.01); *G06F 13/20* (2013.01); *G11C 7/1048* (2013.01); *G11C 7/1096* (2013.01); *G11C 11/4093* (2013.01); *G06F 2213/40* (2013.01)

(58) Field of Classification Search
CPC ......... G11C 11/40622; G11C 11/40611; G11C 11/4078
See application file for complete search history.

(56) References Cited

U.S. PATENT DOCUMENTS

| | | | |
|---|---|---|---|
| 9,977,731 B2 * | 5/2018 | Pyeon ................. | G06F 12/0238 |
| 2005/0243641 A1 | 11/2005 | Lee | |
| 2010/0058003 A1 * | 3/2010 | Goto ...................... | G11C 16/10 |
| | | | 711/E12.001 |
| 2016/0093379 A1 * | 3/2016 | Siciliani .............. | G11C 11/5642 |
| | | | 365/185.12 |
| 2017/0018296 A1 | 1/2017 | Jeong et al. | |
| 2020/0150893 A1 * | 5/2020 | Kim ...................... | G06F 3/0655 |
| 2022/0068428 A1 | 3/2022 | Paik | |
| 2023/0326517 A1 | 10/2023 | Lee et al. | |

FOREIGN PATENT DOCUMENTS

KR    1020190013106 A    2/2019

* cited by examiner

*Primary Examiner* — Min Huang
(74) *Attorney, Agent, or Firm* — WILLIAM PARK AND ASSOCIATES LTD.

(57) ABSTRACT

A semiconductor system includes a first semiconductor apparatus and a second semiconductor apparatus. The first semiconductor apparatus transmits a command signal during a command cycle and transmits an address signal during an address cycle. The first semiconductor apparatus transmits a selection signal during a LUN selection cycle before the command cycle. The second semiconductor apparatus performs a data input/output operation based on the selection signal, the command signal, and the address signal.

15 Claims, 10 Drawing Sheets

FIG. 4

| BIT | <7> | <6> | <5> | <4> | <3> | <2> | <1> | <0> |
|---|---|---|---|---|---|---|---|---|
| LS | \multicolumn{4}{c}{Plane <0:3>} | | | | LUN <0:3> | |

| BIT | <7> | <6> | <5> | <4> | <3> | <2> | <1> | <0> |
|---|---|---|---|---|---|---|---|---|
| LS | Plane <0:3> | | | | LUN <0:3> | | | |

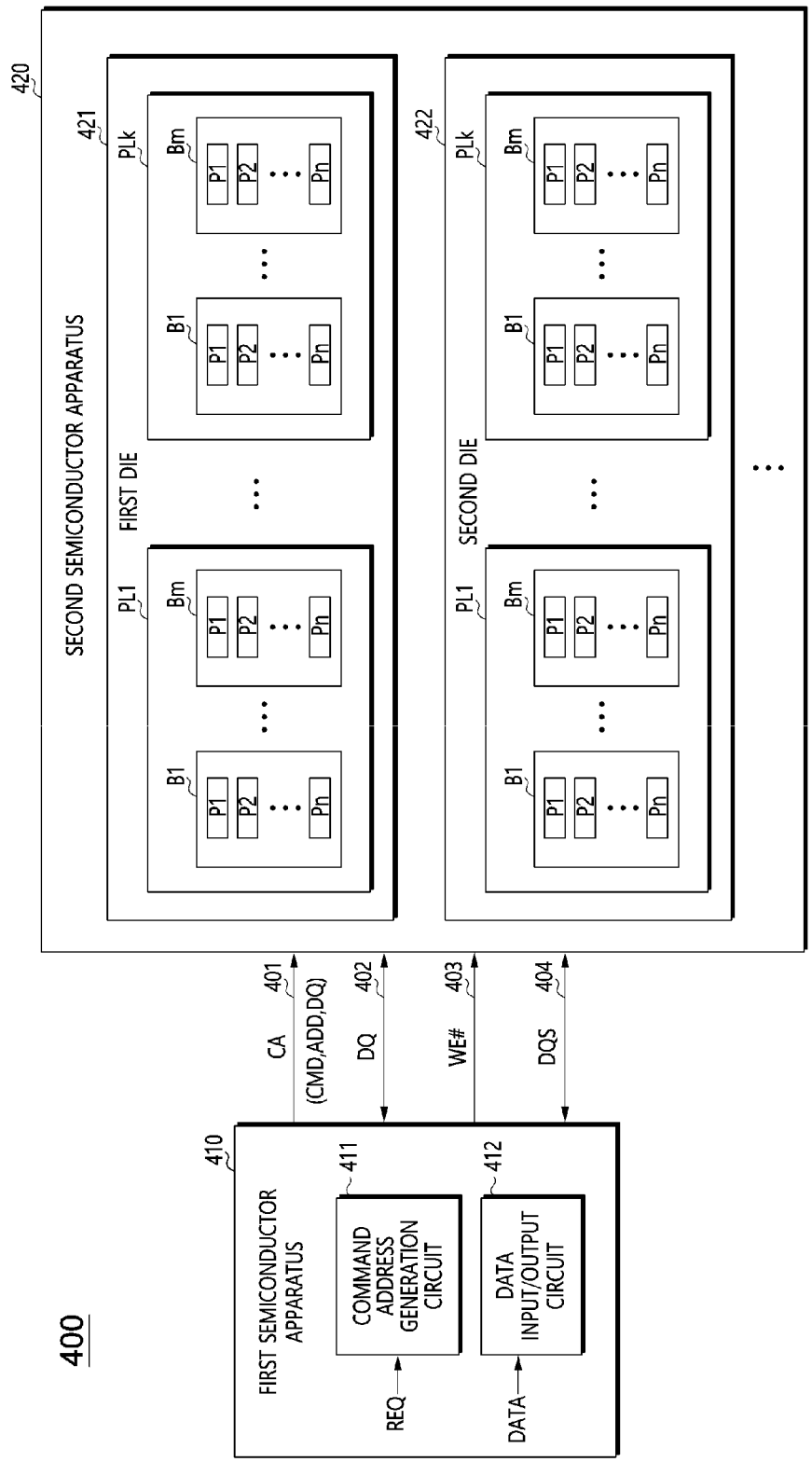

SEMICONDUCTOR APPARATUS AND SEMICONDUCTOR SYSTEM HAVING LUN SELECTION CYCLE, AND OPERATING METHOD OF SEMICONDUCTOR SYSTEM

CROSS-REFERENCES TO RELATED APPLICATION

The present application claims the benefit under 35 U.S.C. § 119(e) of U.S. Provisional application No. 63/328,521, filed on Apr. 7, 2022, and claims priority to Korean application number 10-2023-0031254, filed on Mar. 9, 2023, in the Korean Intellectual Property Office, which is incorporated herein by reference in its entirety.

BACKGROUND

1. Technical Field

The present disclosure relates to an integrated circuit technology, and more particularly, to a semiconductor apparatus and a semiconductor system having a LUN selection cycle.

2. Related Art

An electronic device includes many electronic components, and among them, a computer system may include many semiconductor apparatuses, each made of semiconductors. The semiconductor apparatuses constituting the computer system may include a processor or a memory controller operating as a master device and a memory apparatus or a storage device operating as a slave device. The master device may provide a command address signal to the slave device, and the slave device may perform various operations based on the command address signal. The master device and the slave device may also transmit and receive data to and from each other.

In a NAND flash memory system, a NAND flash memory apparatus may communicate with a memory controller through various interface methods. In a NAND interface method, a command address signal and data may be transmitted through substantially the same input/output bus. As the operating frequency of the NAND flash memory system increases, command overhead increases in the NAND interface method, which may cause a deterioration in the performance of the memory system. In a serial command address (SCA) interface method, a command address signal and data may be transmitted through different input/output buses. Although the SCA interface method may partially reduce the command overhead, an internal circuit of the NAND flash memory apparatus may be overly complicated in order to perform operations of a plurality of NAND flash memory apparatuses in parallel.

SUMMARY

In accordance with an embodiment of the present disclosure, a semiconductor system may include a first semiconductor apparatus and a second semiconductor apparatus. The first semiconductor apparatus may be configured to provide a command signal and an address signal, to transmit the command signal during a command cycle, to transmit the address signal during an address cycle, and to transmit a selection signal during a logical unit number (LUN) selection cycle before the command cycle. The second semiconductor apparatus may include a first die and a second die. Each of the first and second dies may be configured to perform a data input/output operation based on the selection signal, the command signal, and the address signal.

In accordance with an embodiment of the present disclosure, an operating method of a semiconductor system may include, by a first semiconductor apparatus, transmitting a selection signal during a logical unit number (LUN) selection cycle. The operating method may include, by the first semiconductor apparatus, transmitting a command signal instructing a data output operation. The operating method may include, by first semiconductor apparatus, transmitting an address signal. And the operating method may include, by a second semiconductor apparatus, reading data from a memory cell array based on the selection signal and the address signal.

In accordance with an embodiment of the present disclosure, an operating method of a semiconductor system may include, by a first semiconductor apparatus, transmitting a selection signal during a logical unit number (LUN) selection cycle. The operating method may include, by the first semiconductor apparatus, transmitting a data input command signal. The operating method may include, by a second semiconductor apparatus, initializing a plurality of page buffers based on the selection signal. And the operating method may include, by the first semiconductor apparatus, transmitting an address signal.

BRIEF DESCRIPTION OF THE DRAWINGS

FIG. 4 is a table illustrating the configuration of a selection signal in accordance with an embodiment of the present disclosure.

FIG. 5 is a diagram illustrating the configuration of a semiconductor system in accordance with an embodiment of the present disclosure.

DETAILED DESCRIPTION

Figure 1:
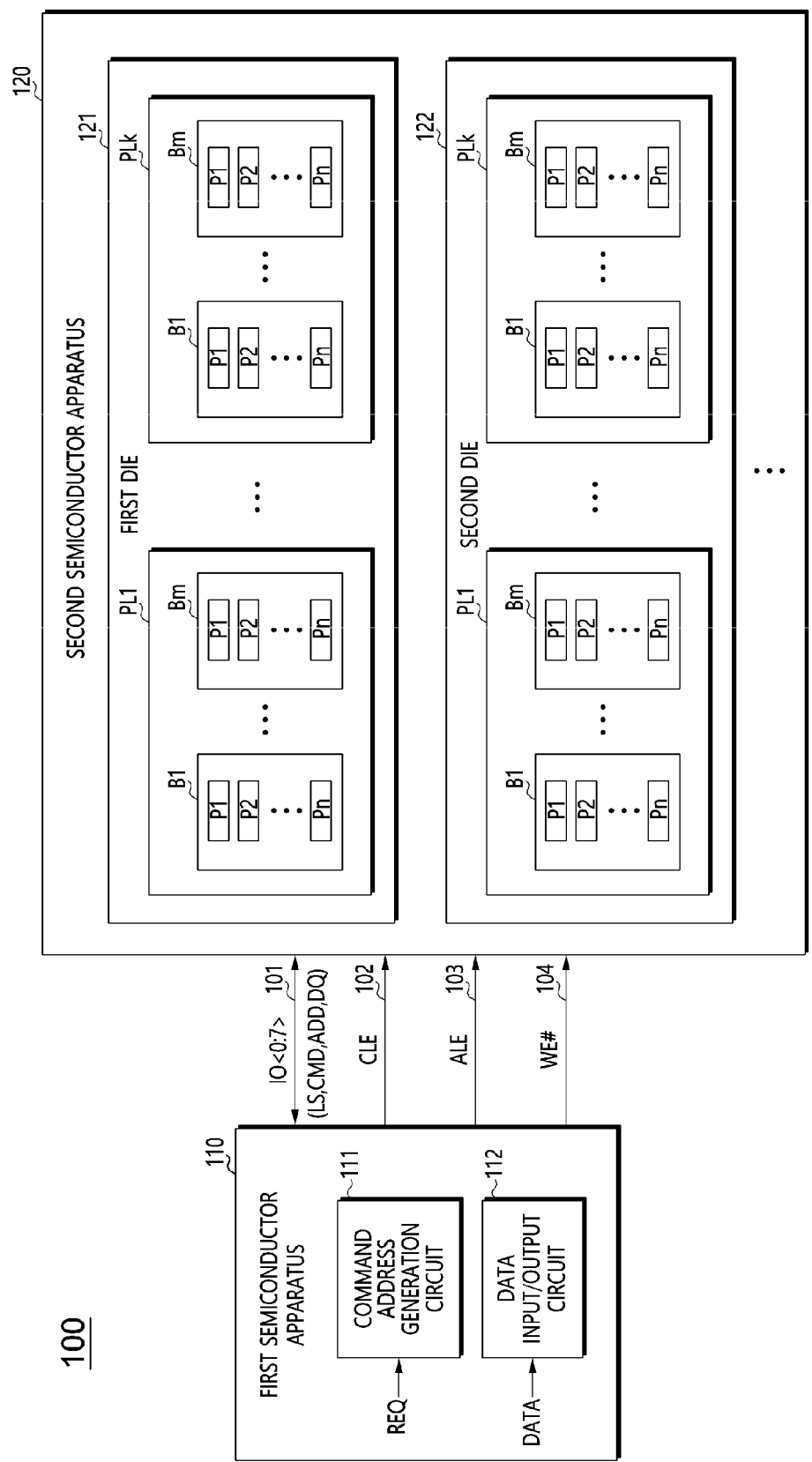
FIG. 1 is a diagram illustrating the configuration of a semiconductor system in accordance with an embodiment of the present disclosure.

FIG. 1 is a diagram illustrating the configuration of a semiconductor system 1 in accordance with an embodiment of the present disclosure. In FIG. 1, the semiconductor system 1 may include a first semiconductor apparatus 110 and a second semiconductor apparatus 120. The first semiconductor apparatus 110 may provide various control signals used to operate the second semiconductor apparatus 120. The first semiconductor apparatus 110 may include various types of master devices. For example, the first semiconductor apparatus 110 may be a host device, such as a central processing unit (CPU), a graphics processing unit (GPU), a multi-media processor (MMP), a digital signal processor, an application processor (AP), and a memory controller. The second semiconductor apparatus 120 may be a slave device that performs various operations under the control of the first semiconductor apparatus 110 and may be, for example, a memory apparatus. The memory apparatus may include volatile memory and nonvolatile memory. Examples of the volatile memory may include a static RAM (SRAM), a dynamic RAM (DRAM), and a synchronous DRAM (SDRAM), and examples of the nonvolatile memory may include a read only memory (ROM), a programmable ROM (PROM), and an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM), and the like.

The first semiconductor apparatus 110 may be connected to the second semiconductor apparatus 120 through a plurality of buses. The plurality of buses may be signal transmission paths, links, or channels for transmitting signals. The plurality of buses may include an input/output bus 101, a command control bus 102, an address control bus 103, and the like. The input/output bus 101 may be a bidirectional bus, and the command control bus 102 and the address control bus 103 may be unidirectional buses from the first semiconductor apparatus 110 to the second semiconductor apparatus 120. The first semiconductor apparatus 110 may provide input/output signals IO<0:7> to the second semiconductor apparatus 120 through the input/output bus 101 and may receive the input/output signals IO<0:7> from the second semiconductor apparatus 120 through the input/output bus 101. The input/output signals IO<0:7> transmitted from the first semiconductor apparatus 110 to the second semiconductor apparatus 120 may include a selection signal LS, a command signal CMD, an address signal ADD, and data DQ. The input/output signals IO<0:7> transmitted from the second semiconductor apparatus 120 to the first semiconductor apparatus 110 may include the data DQ. The command signal CMD may include command information specifying an operation performed by the second semiconductor apparatus 120. The address signal ADD may include address information for accessing a storage area of the second semiconductor apparatus 120. The first semiconductor apparatus 110 may transmit a command latch enable signal CLE to the second semiconductor apparatus 120 through the command control bus 102. The first semiconductor apparatus 110 may transmit an address latch enable signal ALE to the second semiconductor apparatus 120 through the address control bus 103. The command latch enable signal CLE and the address latch enable signal ALE may be signals capable of identifying which of the selection signal LS, the command signal CMD, and the address signal ADD, and the data DQ are included in the input/output signals IO<0:7>. The command latch enable signal CLE and the address latch enable signal ALE may be selectively enabled when the input/output signals IO<0:7> are transmitted. The second semiconductor apparatus 120 may receive the input/output signals IO<0:7> as one of the selection signal LS, the command signal CMD, and the address signal ADD, and the second semiconductor apparatus 120 may receive the data DQ according to enable states of the command latch enable signal CLE and the address latch enable signal ALE.

The plurality of buses may further include a write control bus 104, and the first semiconductor apparatus 110 may be connected to the second semiconductor apparatus 120 through the write control bus 104. The write control bus 104 may be a unidirectional bus from the first semiconductor apparatus 110 to the second semiconductor apparatus 120. The first semiconductor apparatus 110 may provide a write enable signal WE# to the second semiconductor apparatus 120 through the write control bus 104. The write enable signal WE# may be a signal defining a period in which the second semiconductor apparatus 120 receives the input/output signals IO<0:7> as valid signals. For example, in a period in which the write enable signal WE# is enabled, the second semiconductor apparatus 120 may sample, as valid signals, the input/output signals IO<0:7> transmitted from the first semiconductor apparatus 110 and may generate the selection signal LS, the command signal CMD, the address signal ADD, and the data DQ from the input/output signals IO<0:7>.

The first semiconductor apparatus 110 may include a command address generation circuit 111 and a data input/output circuit 112. The command address generation circuit 111 may generate the input/output signal IO<0:7> including the selection signal LS, the command signal CMD, and the address signal ADD based on a user's request REQ. The command address generation circuit 111 may transmit the input/output signals IO<0:7> including the selection signal LS, the command signal CMD, and the address signal ADD to the second semiconductor apparatus 120 through the input/output bus 101. The command address generation circuit 111 may transmit the input/output signals IO<0:7> to the second semiconductor apparatus 120 during at least one cycle according to the lengths and/or the total number of bits of the selection signal LS, the command signal CMD, and the address signal ADD. For example, the selection signal LS and the command signal CMD may be transmitted during one cycle, and the address signal ADD may be transmitted during a plurality of cycles. The command address generation circuit 111 may sequentially generate and transmit the selection signal LS, the command signal CMD, and the address signal ADD so that the second semiconductor apparatus 120 may perform at least one specific operation. For example, in order to instruct the second semiconductor apparatus 120 to perform a data input/output operation according to the request REQ, the command address generation circuit 111 may first transmit the input/output signal IO<0:7> including the selection signal LS, transmit the input/output signal IO<0:7> including the command signal CMD after transmitting the selection signal LS, and transmit the input/output signal IO<0:7> including the address signal ADD after transmitting the command signal CMD. For example, in order to instruct the second semiconductor apparatus 120 to perform the data output operation, the command address generation circuit 111 may sequentially transmit the selection signal LS, the command signal CMD, the address signal ADD, and the command signal CMD. In order to instruct the second semiconductor apparatus 120 to perform the data input operation, the command address generation circuit 111 may sequentially transmit the selection signal LS, the command signal CMD, and the address signal ADD. The data output operation may refer to an operation of transmitting the data DQ from the second semiconductor apparatus 120 to the first semiconductor apparatus 110, and the data input operation may refer to an operation of transmitting the data DQ from the first semiconductor apparatus 110 to the second semiconductor apparatus 120. In one example, the data output operation may be a random data output operation. The random data output operation may refer to an operation of changing a column address signal after a page read operation of the second semiconductor apparatus 120 is performed and transmitting data read from the second semiconductor apparatus 120 based on the changed column address signal to the first semiconductor apparatus 110 as the data DQ. The data input operation may be a random data input operation. The random data input operation may refer to an operation of transmitting the data DQ to be used for a page program operation of the second semiconductor apparatus 120 from the first semiconductor apparatus 110 to the second semiconductor apparatus 120 before the page program operation is performed.

The data input/output circuit 112 may be connected to the input/output bus 101 and may transmit and receive the input/output signals IO<0:7> through the input/output bus 101. During the data output operation, the data input/output circuit 112 may receive the input/output signals IO<0:7> including the data DQ from the second semiconductor apparatus 120 and may generate internal data DATA. During the data input operation, the data input/output circuit 112 may generate the data DQ from the internal data DATA and may transmit the input/output signals IO<0:7> including the data DQ to the second semiconductor apparatus 120. The data input/output circuit 112 may receive the data DQ from the second semiconductor apparatus 120 after the selection signal LS, the command signal CMD, and the address signal ADD may be transmitted by the command address generation circuit 111 during the data output operation. The data input/output circuit 112 may transmit the data DQ to the second semiconductor apparatus 120 after the selection signal LS, the command signal CMD, and the address signal ADD may be transmitted by the command address generation circuit 111 during the data input operation.

The second semiconductor apparatus 120 may include a plurality of dies. Each of the plurality of dies may perform a data input/output operation independently of the first semiconductor apparatus 110. For example, the second semiconductor apparatus 120 may include at least a first die 121 and a second die 122. The first die 121 and the second die 122 may have substantially the same configuration. Each of the first and second dies 121 and 122 may include a memory cell array. The memory cell array of the first die 121 may include a plurality of planes PL1, . . . , and PLk (k is an integer of 2 or more). Each of the plurality of planes PL1, . . . , and PLk may include a plurality of blocks B1, . . . , and Bm (m is an integer of 2 or more). One block may mean a unit that can be erased at one time. Each of the plurality of blocks B1, . . . , and Bm may include a plurality of pages P1, P2, . . . , and Pn (n is an integer of 3 or more). The page may mean a unit that can be programmed or read at one time. Each of the plurality of blocks B1, . . . , and Bm is composed of the plurality of pages P1, P2, . . . , and Pn and a plurality of strings (not illustrated), and a plurality of memory cells may be connected to points at which the plurality of pages P1, P2, . . . , and Pn intersect the plurality of strings. When a specific page, among the plurality of pages P1, P2, . . . , and Pn, and a specific string, among the plurality of strings, are selected, a memory cell connected between the selected page and the selected string may be accessed. Similar to the first die 121, the memory cell array of the second die 122 may include a plurality of planes PL1, . . . , and PLk, and each of the plurality of planes PL1, . . . , and PLk may include a plurality of blocks B1, . . . , and Bm. Each of the plurality of blocks B1, . . . , and Bm may include a plurality of pages P1, P2, . . . , and Pn. The first and second dies may each include a plurality of page buffers (not illustrated) connected to the plurality of strings in a one-to-one manner. The plurality of page buffers may perform an operation of programming data into a memory cell connected to the string or reading data stored in the memory cell connected to the string. The plurality of page buffers provided in each of the plurality of planes PL1, . . . , and PLk may be independently activated.

The selection signal LS may include information for selecting one of the plurality of dies included in the second semiconductor apparatus 120. For example, in order to perform the data output operation or the data input operation on the first die 121, the selection signal LS may include information for selecting the first die 121. In order to perform the data output operation or the data input operation on the second die 122, the selection signal LS may include information for selecting the second die 122. The selection signal LS may include information for selecting one of the plurality of dies and information for selecting at least one of a plurality of planes PL1, . . . , and PLk of the selected die. For example, in order to perform the data output operation or the data input operation on the second plane PL2 of the first die 121, the selection signal LS may include information for selecting the first die 121 and the second plane PL2 of the first die 121. In order to perform the data output operation or the data input operation on the first plane PL1 of the second die 122, the selection signal LS may include information for selecting the second die 122 and the first plane PL1 of the second die 122. Each of the first and second dies 121 and 122 may further include internal circuits for processing the input/output signals IO<0:7>, the command latch enable signal CLE, the address latch enable signal ALE, and the write enable signal WE# transmitted from the first semiconductor apparatus 110. The internal circuits will be described below.

Figure 2A:
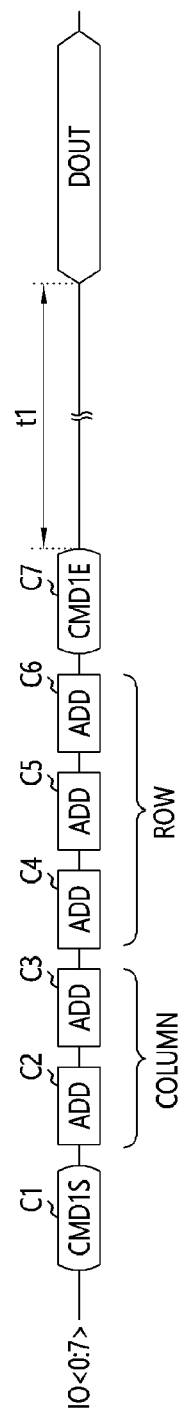
FIG. 2A is a timing diagram illustrating signals transmitted from a general semiconductor system during a data output operation.

FIG. 2A is a timing diagram illustrating signals transmitted in a general semiconductor system during a data output operation. In the general semiconductor system, the selection signal LS of FIG. 1 might not be used. Referring to FIG. 2A, in the general semiconductor system, a first semiconductor apparatus may sequentially provide command signals CMD1S and CMD1E and an address signal ADD so that a second semiconductor apparatus may perform a data output operation. The first semiconductor apparatus may provide the command signal CMD1S instructing the data output operation to the second semiconductor apparatus in a first cycle C1. The first cycle C1 may be a command cycle. The command signal CMD1S transmitted during the first cycle C1 may be a start command signal of a random data output command. After the command signal CMD1S is provided, the first semiconductor apparatus may provide the address signal ADD to the second semiconductor apparatus in second to sixth cycles C2 to C6. The second to sixth cycles C2 to C6 may be address cycles. In the second and third cycles C2 and C3, the first semiconductor apparatus may transmit the address signal ADD including column address information COLUMN for selecting a string of the second semiconductor apparatus, and in the fourth to sixth cycles C4 to C6, the first semiconductor apparatus may transmit the address signal ADD including row address information ROW for selecting a die and a plane of the second semiconductor apparatus. After the address signal ADD is provided, the first semiconductor apparatus may provide the command signal CMD1E to the second semiconductor apparatus in the seventh cycle C7. The seventh cycle C7 may be a command cycle. The command signal CMD1E transmitted in the seventh cycle C7 may be an end command signal of the random data output command. After the command signal CMDE1 is provided, the second semiconductor apparatus may prepare for a data output operation by selecting a specific die and a specific plane based on the address signal ADD during a first time t1. The first time t1 may be tWHR2 defined in the joint electron device engineering council (JEDEC) STANDARD. The first time t1 may refer to a time required from the time point at which the end command signal of the random data output command is transmitted to the time point at which a specific die and a specific plane are selected, data is read from the selected plane based on the address signal ADD including the column address information COLUMN, and an input/output signal is generated from the read data. When the first time t1 elapses after the command signal CMD1E is transmitted, the second semiconductor apparatus may transmit data DOUT to the first semiconductor apparatus as the input/output signals IO<0:7>.

Figure 2B:
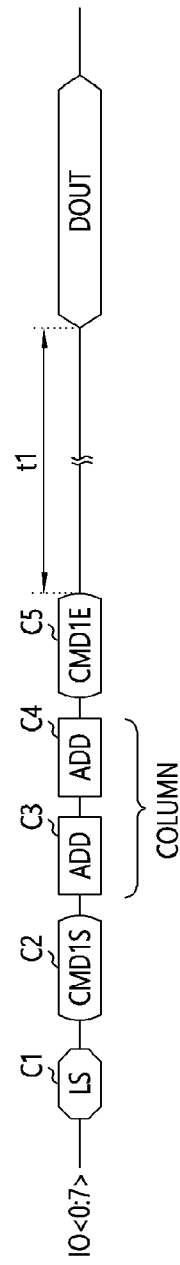
FIG. 2B is a timing diagram illustrating signals transmitted from the semiconductor system in accordance with an embodiment of the present disclosure during a data output operation.

FIG. 2B is a timing diagram illustrating signals transmitted from the semiconductor system 100 in accordance with an embodiment of the present disclosure during a data output operation. The semiconductor system 100 may have a logical unit number (LUN) selection cycle before a command cycle. Referring to FIG. 1 and FIG. 2B, in the semiconductor system 100, the first semiconductor apparatus 110 may sequentially provide the selection signal LS, the command signals CMD1S and CMD1E, and the address signal ADD so that the second semiconductor apparatus 120 may perform a data output operation. The first semiconductor apparatus 110 may transmit the selection signal LS to the second semiconductor apparatus 120 in a first cycle C1. The first cycle C1 may be a LUN selection cycle. The selection signal LS may include information for selecting a die and/or a plane that performs a data output operation corresponding to the command signals CMD1S and CMD1E transmitted in a command cycle to be described below. The selection signal LS may include row address information for selecting a specific die and specific plane of the second semiconductor apparatus 120. After the selection signal LS is provided, the first semiconductor apparatus 110 may provide the command signal CMD1S instructing the data output operation to the second semiconductor apparatus 120 in a second cycle C2. The second cycle C2 may be the command cycle. The command signal CMD1S transmitted during the second cycle C2 may be a start command signal of a random data output command. After the command signal CMD1S is provided, the first semiconductor apparatus 110 may provide the address signal ADD to the second semiconductor apparatus 120 in third and fourth cycles C3 and C4. The third and fourth cycles C3 and C4 may be address cycles. In the third and fourth cycles C3 and C4, the first semiconductor apparatus 110 may transmit the address signal ADD including column address information COLUMN for selecting a string of the second semiconductor apparatus 120. Because row address information for selecting a die and a plane of the second semiconductor apparatus 120 has been transmitted as the selection signal LS in the first cycle C1, the first semiconductor apparatus 110 might not transmit the address signal ADD including the row address information again. After the address signal ADD is provided, the first semiconductor apparatus 110 may provide the command signal CMD1E to the second semiconductor apparatus 120 in a fifth cycle C5. The fifth cycle C5 may be a command cycle. The command signal CMD1E transmitted in the fifth cycle C5 may be an end command signal of the random data output command. After the command signal CMD1E is provided, the second semiconductor apparatus 120 may prepare for the data output operation by selecting a specific die and a specific plane based on the selection signal LS during the first time t1 and reading data from the specific plane based on the address signal ADD including the column address information COLUMN. When the first time t1 elapses after the command signal CMD1E is transmitted, the second semiconductor apparatus 120 may transmit the data DOUT to the first semiconductor apparatus 110 as the input/output signals IO<0:7>. Because the semiconductor system 100 has the LUN selection cycle, it might not include the address cycle corresponding to the fourth to sixth cycles C4 to C6 in FIG. 2A. Accordingly, command overhead for the data output operation of the semiconductor system 100 can be reduced by a time corresponding to three address cycles compared to the general semiconductor system.

Figure 3A:
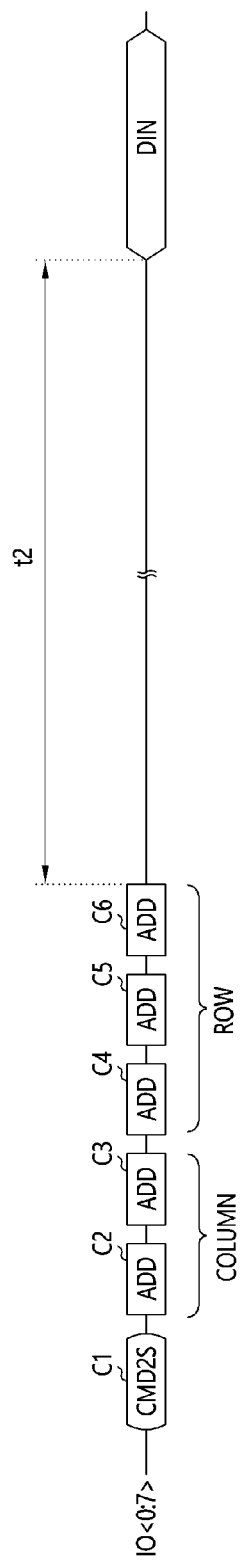
FIG. 3A is a timing diagram illustrating signals transmitted from the general semiconductor system during a data input operation.

FIG. 3A is a timing diagram illustrating signals transmitted in the general semiconductor system during a data input operation. Referring to FIG. 3A, in the general semiconductor system, the first semiconductor apparatus may sequentially provide a command signal CMD2S and an address signal ADD so that the second semiconductor apparatus may perform a data input operation. The first semiconductor apparatus may provide the command signal CMD2S instructing the data input operation to the second semiconductor apparatus in a first cycle C1. The first cycle C1 may be a command cycle. The command signal CMD2S transmitted during the first cycle C1 may be a start command signal of a random data input command. After the command signal CMD2S is provided, the first semiconductor apparatus may provide the address signal ADD to the second semiconductor apparatus in second to sixth cycles C2 to C6. The second to sixth cycles C2 to C6 may be address cycles. In the second and third cycles C2 and C3, the first semiconductor apparatus may transmit the address signal ADD including column address information COLUMN for selecting a string of the second semiconductor apparatus, and in the fourth to sixth cycles C4 to C6, the first semiconductor apparatus may transmit the address signal ADD including row address information ROW for selecting a die and a plane of the second semiconductor apparatus. After the address signal ADD is provided, the second semiconductor apparatus 120 may prepare for the data input operation by selecting a specific die and a specific plane based on the address signal ADD during a second time t2. The second time t2 may be tADL of the JEDEC STANDARD. The second time t2 may refer to a time required until a specific die and a specific plane are selected after the address signal ADD is transmitted, and latch values of a plurality of page buffers connected to the selected plane may be initialized. When the second time t2 elapses after the address signal ADD is transmitted in the sixth cycle C6, the first semiconductor apparatus may transmit data DIN to the second semiconductor apparatus as the input/output signals IO<0:7>.

Figure 3B:
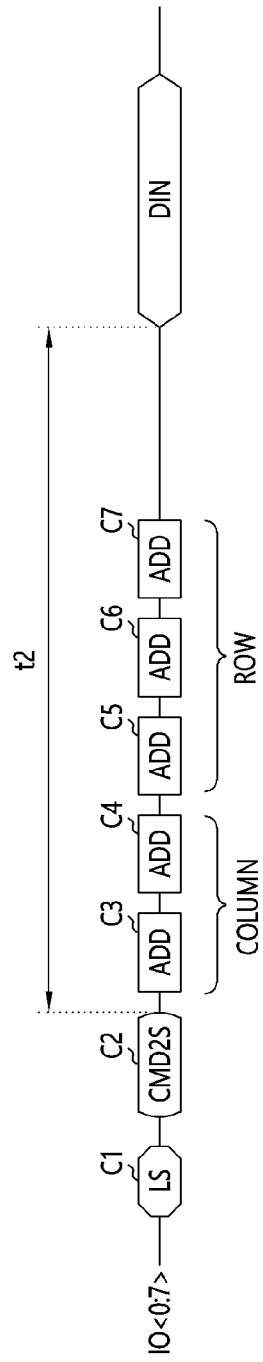
FIG. 3B is a timing diagram illustrating signals transmitted from the semiconductor system in accordance with an embodiment of the present disclosure during a data input operation.

FIG. 3B is a timing diagram illustrating signals transmitted from the semiconductor system 100 in accordance with an embodiment of the present disclosure during a data input operation. Referring to FIG. 1 and FIG. 3B, in the semiconductor system 100, the first semiconductor apparatus 110 may sequentially provide the selection signal LS, the command signal CMD2S, and the address signal ADD so that the second semiconductor apparatus 120 may perform a data input operation. The first semiconductor apparatus 110 may transmit the selection signal LS to the second semiconductor apparatus 120 in a first cycle C1. The first cycle C1 may be a logical unit number (LUN) selection cycle. The selection signal LS may include information for selecting a die and/or a plane that performs a data input operation corresponding to a command signal CMD2S transmitted in a command cycle to be described below. The selection signal LS may include row address information for selecting a specific die and specific plane of the second semiconductor apparatus 120. After the selection signal LS is provided, the first semiconductor apparatus 110 may provide a command signal CMD2S instructing the data input operation to the second semiconductor apparatus 120 in a second cycle C2. The second cycle C2 may be the command cycle. The command signal CMD2S transmitted during the second cycle C2 may be a start command signal of a random data input command. After the command signal CMD2S is provided, the first semiconductor apparatus 110 may provide the address signal ADD to the second semiconductor apparatus 120 in third to seventh cycles C3 to C7. The third to seventh cycles C3 to C7 may be address cycles. The address signal ADD transmitted in the third and fourth cycles C3 and C4 may include the column address information COLUMN, and the address signal ADD transmitted in the fifth to seventh cycles C5 to C7 may include the row address information ROW. The row address information ROW included in the address signal ADD transmitted in the fifth to seventh cycles C5 to C7 may be substantially the same as row address information included in the selection signal LS, and the fifth to seventh cycles C5 to C7 may be dummy. However, in the data input operation, because the first semiconductor apparatus 110 transmits no end command signal of the random data input command until the data DIN is transmitted to the second semiconductor apparatus 120, the semiconductor system 100 may still include the fifth to seventh cycles C5 to C7. Because the first semiconductor apparatus 110 has transmitted the selection signal LS for selecting the die and plane of the second semiconductor apparatus 120 in the first cycle C1, the second semiconductor apparatus 120 may prepare for a data input operation by selecting a specific die and a specific plane based on the selection signal LS during the second time t2 from the time point at which the command signal CMD2S is received in the second cycle C2. When the second time t2 elapses after the command signal CMD2S is transmitted, the first semiconductor apparatus 110 may transmit the data DIN to the second semiconductor apparatus 120 as the input/output signal. Because the semiconductor system 100, in accordance with an embodiment of the present disclosure, has the LUN selection cycle, the second semiconductor apparatus 120 can prepare for the data input operation before the address cycle, and command overhead for the data input operation of the semiconductor system 100 may be reduced by a time corresponding to five address cycles compared to the general semiconductor system.

FIG. 4 is a table showing the configuration of the selection signal LS in accordance with an embodiment of the present disclosure. Referring to FIG. 1 and FIG. 4, the first semiconductor apparatus 110 may transmit the selection signal LS as the input/output signals IO<0:7> in a LUN selection cycle. When the input/output bus 101 includes 8 serial signal transmission lines, the selection signal LS may include 8 bits. First to fourth bits <0> to <3> of the selection signal LS may be used as die selection information LUN<0:3> for selecting a specific die from the plurality of dies of the second semiconductor apparatus 120. The first semiconductor apparatus 110 may individually select one of a maximum of 16 dies of the second semiconductor apparatus 120 by using the first to fourth bits <0:3> of the selection signal LS. Fifth to eighth bits <4> to <7> of the selection signal LS may be used as plane selection information Plane<0:3> for selecting a specific plane from the plurality of planes included in the plurality of dies of the second semiconductor apparatus 120. The first semiconductor apparatus 110 may individually select at least one of the maximum of 16 planes of each die by using the fifth to eighth bits <4:7> of the selection signal LS.

FIG. 5 is a diagram illustrating the configuration of a semiconductor system 400 in accordance with an embodiment of the present disclosure. Referring to FIG. 5, the semiconductor system 400 may include a first semiconductor apparatus 410 and a second semiconductor apparatus 420. The first semiconductor apparatus 410 may include a command address generation circuit 411 and a data input/output circuit 412. The second semiconductor apparatus 420 may include a plurality of dies. For example, the second semiconductor apparatus 420 may include a first die 421 and a second die 422. The first die 421 may include a memory cell array, and the memory cell array may include a plurality of planes PL1, . . . , and PLk (k is an integer of 2 or more). Each of the plurality of planes PL1, . . . , and PLk may include a plurality of blocks B1, . . . , and Bm (m is an integer of 2 or more), and each of the plurality of blocks B1, . . . , and Bm may include a plurality of pages P1, P2, . . . , and Pn (n is an integer of 3 or more). The second die 422 may include a memory cell array, and the memory cell array may include a plurality of planes PL1, . . . , and PLk. Each of the plurality of planes PL1, . . . , and PLk may include a plurality of blocks B1, . . . , and Bm, and each of the plurality of blocks B1, . . . , and Bm may include a plurality of pages P1, P2, . . . , and Pn. The first and second semiconductor apparatuses 410 and 420 may have substantially the same configuration as the first and second semiconductor apparatuses 110 and 120, illustrated in FIG. 1. Redundant descriptions of substantially the same components will be omitted.

The first semiconductor apparatus 410 may be connected to the second semiconductor apparatus 420 through a plurality of buses. The plurality of buses may include a command address bus 401, a data bus 402, a write control bus 403, and a data strobe bus 404. The command address bus 401 and the write control bus 403 may be unidirectional buses from the first semiconductor apparatus 410 to the second semiconductor apparatus 420. The data bus 402 and the data strobe bus 404 may be bi-directional buses. The first semiconductor apparatus 410 may be connected to the second semiconductor apparatus 420 through the command address bus 401 and may provide a command address signal CA to the second semiconductor apparatus 420 through the command address bus 401. The command address signal CA may include a command signal CMD, an address signal ADD, and a selection signal LS. The command address generation circuit 411 may be connected to the command address bus 401 and may transmit the command address signal CA generated according to a user's request REQ to the semiconductor apparatus 420 through the command address bus 401. The first semiconductor apparatus 410 may be connected to the second semiconductor apparatus 420 through the data bus 402 and may provide the data DQ to the second semiconductor apparatus 420 through the data bus 402 or receive the data DQ from the second semiconductor apparatus 420 through the data bus 402. In the semiconductor system 100 of FIG. 1, the command signal CMD, the address signal ADD, the selection signal LS, and the data DQ may be all transmitted through the input/output bus 101. However, in the semiconductor system 400, a bus through which the command signal CMD, the address signal ADD, and the selection signal LS are transmitted may be separated from a bus through which the data DQ is transmitted. The first semiconductor apparatus 410 may be connected to the second semiconductor apparatus 420 through the write control bus 403 and may provide a write enable signal WE# to the second semiconductor apparatus 420 through the write control bus 403. The first semiconductor apparatus 410 may be connected to the second semiconductor apparatus 420 through the data strobe bus 404 and may transmit a data strobe signal DQS to the second semiconductor apparatus 420 through the data strobe bus 404 or receive the data strobe signal DQS from the second semiconductor apparatus 420 through the data strobe bus 404. The data strobe signal DQS may be a signal synchronized with the data DQ and may be a clock signal that toggles while the data DQ is transmitted. When the data DQ is provided to the second semiconductor apparatus 420, the first semiconductor apparatus 410 may provide the second semiconductor apparatus 420 with the data strobe signal DQS synchronized with the data DQ. When the data DQ is provided to the first semiconductor apparatus 410, the second semiconductor apparatus 420 may provide the first semiconductor apparatus 410 with the data strobe signal DQS synchronized with the data DQ.

Figure 6A:
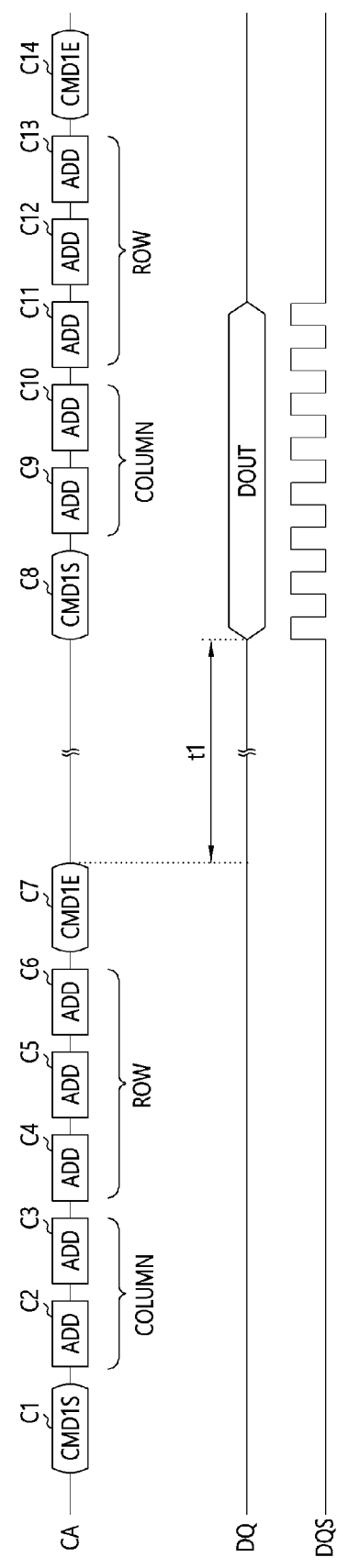
FIG. 6A is a timing diagram illustrating signals transmitted from a general semiconductor system during a data output operation.

FIG. 6A is a timing diagram illustrating signals transmitted in a general semiconductor system during a data output operation. Referring to FIG. 6A, in the general semiconductor system, a first semiconductor apparatus may sequentially provide command signals CMD1S and CMD1E and an address signal ADD so that a second semiconductor apparatus may perform a data output operation. The first semiconductor apparatus may provide the command signal CMD1S instructing the data output operation to the second semiconductor apparatus in a first cycle C1. The first cycle C1 may be a command cycle. The command signal CMD1S transmitted during the first cycle C1 may be a start command signal of a random data output command. After the command signal CMD1S is provided, the first semiconductor apparatus may provide the address signal ADD to the second semiconductor apparatus in second to sixth cycles C2 to C6. The second to sixth cycles C2 to C6 may be address cycles. In the second and third cycles C2 and C3, the first semiconductor apparatus may transmit the address signal ADD including column address information COLUMN for selecting a string of the second semiconductor apparatus, and in the fourth to sixth cycles C4 to C6, the first semiconductor apparatus may transmit the address signal ADD including row address information ROW for selecting a die and a plane of the second semiconductor apparatus. After the address signal ADD is provided, the first semiconductor apparatus may provide the command signal CMD1E to the second semiconductor apparatus in a seventh cycle C7. The seventh cycle C7 may be a command cycle. The command signal CMD1E transmitted in the seventh cycle C7 may be an end command signal of the random data output command. During the first to seventh cycles C1 to C7, the first semiconductor apparatus may transmit the command signals CMD1S and CMD1E and the address signal ADD to the second semiconductor apparatus through the command address bus 401 of FIG. 5. After the command signal CMD1E is provided in the seventh cycle C7, the second semiconductor apparatus may prepare for a data output operation by selecting a specific die and a specific plane based on the address signal ADD including the row address information ROW during a first time t1 and reading data from the selected plane based on the address signal ADD including the column address information COLUMN. The first time t1 may be tWHR2 of the JEDEC STANDARD. When the first time t1 elapses after the command signal CMD1S is transmitted, the second semiconductor apparatus may transmit data DOUT and a data strobe signal DQS synchronized with the data DOUT to the first semiconductor apparatus through the data bus 402 and the data strobe bus 404 in FIG. 5.

Another data output operation may be performed in parallel before or when the second semiconductor apparatus transmits the data DOUT to the first semiconductor apparatus. For example, before or when the data DOUT is transmitted from the first die to the first semiconductor apparatus, in a case in which the first semiconductor apparatus has instructed the data output operation of the first die of the second semiconductor apparatus in the first to seventh cycles C1 to C7, the first semiconductor apparatus may instruct a data output operation of the second die of the second semiconductor apparatus. The first semiconductor apparatus may transmit the command signal CMD1S corresponding to the start command signal of the random data output command to the second semiconductor apparatus in an eighth cycle C8, transmit the address signal ADD to the second semiconductor apparatus in ninth to thirteenth cycles C9 to C13, and transmit the command signal CMD1E corresponding to the end command signal of the random data output command to the second semiconductor apparatus in a fourteenth cycle C14. The eighth to fourteenth cycles C8 to C14 may partially or completely overlap a period in which the second semiconductor apparatus transmits the data DOUT to the first semiconductor apparatus. In the general semiconductor system, before or when the data DOUT is transmitted from the first die of the second semiconductor apparatus, in a case in which the command signals CMD1S and CMD1E and the address signal ADD are transmitted to the second die, the value of a column address signal of the first die may be changed by the address signal ADD transmitted in the eighth and ninth cycles C8 and C9. Accordingly, when the data output operations of the first and second dies are performed in parallel, each of the first and second dies need to include a complicated internal circuit so that a column address signal of a die that performs a first data output operation is not contaminated by an address signal ADD provided to a die that performs a second data output operation.

Figure 6B:
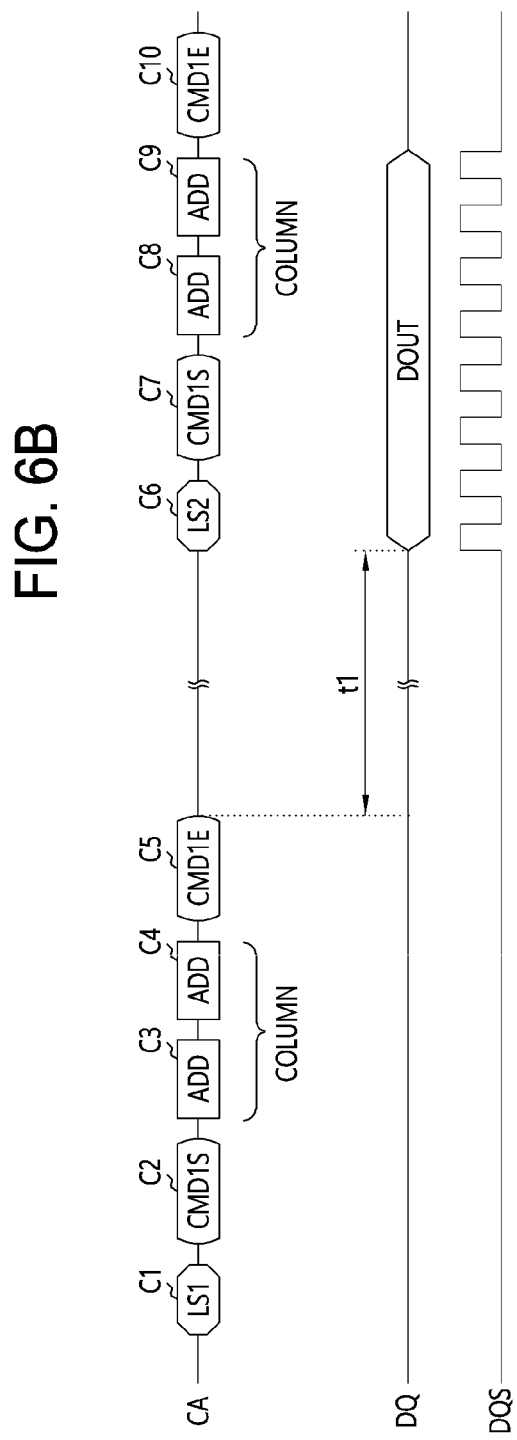
FIG. 6B is a timing diagram illustrating signals transmitted from a semiconductor system in accordance with an embodiment of the present disclosure during a data output operation

FIG. 6B is a timing diagram illustrating signals transmitted from the semiconductor system 400 in accordance with an embodiment of the present disclosure during a data output operation. The semiconductor system 400 may have a LUN selection cycle before a command cycle. Referring to FIG. 5 and FIG. 6B, in the semiconductor system 400, the first semiconductor apparatus 410 may sequentially provide a selection signal LS1, the command signals CMD1S and CMD1E, and the address signal ADD so that the second semiconductor apparatus 420 may perform a data output operation. In a first cycle C1, the first semiconductor apparatus 410 may transmit the selection signal LS1 to the second semiconductor apparatus 420. The first cycle C1 may be a logical unit number (LUN) selection cycle. The selection signal LS1 may include information for selecting a die and/or a plane that performs a data output operation corresponding to the command signals CMD1S and CMD1E transmitted in a command cycle to be described below. The selection signal LS1 may include row address information for selecting a specific die and specific plane of the second semiconductor apparatus 420. For example, the selection signal LS1 may include row address information for selecting a specific plane of the first die of the second semiconductor apparatus 420. After the selection signal LS1 is provided, the first semiconductor apparatus 410 may provide a command signal CMD1S instructing the data output operation to the second semiconductor apparatus 420 in a second cycle C2. The second cycle C2 may be the command cycle. The command signal CMD1S transmitted during the second cycle C2 may be a start command signal of a random data output command. After the command signal CMD1S is provided, the first semiconductor apparatus 410 may provide the address signal ADD to the second semiconductor apparatus 420 in third and fourth cycles C3 and C4. The third and fourth cycles C3 and C4 may be address cycles. The first semiconductor apparatus 410 may transmit the address signal ADD including column address information COLUMN for selecting a string of the second semiconductor apparatus in the third and fourth cycles C3 and C4. Because the row address information for selecting a die and a plane of the second semiconductor apparatus 420 has been transmitted as the selection signal LS1 in the first cycle C1, the first semiconductor apparatus 410 may transmit again no address signal ADD corresponding to the address signal ADD transmitted in the fourth to sixth cycles C4 to C6 in FIG. 6A. After the address signal ADD is provided, the first semiconductor apparatus 410 may provide the command signal CMD1E to the second semiconductor apparatus 420 in the fifth cycle C5. The fifth cycle C5 may be a command cycle. The command signal CMD1E transmitted in the fifth cycle C5 may be an end command signal of the random data output command. The first semiconductor apparatus 410 may transmit the selection signal LS1, the command signals CMD1S and CMD1E, and the address signal ADD through the command address bus 401 of FIG. 6B in the first to fifth cycles C1 to C5. After the command signal CMD1E is provided, the second semiconductor apparatus 420 may prepare for a data output operation by selecting a specific die and a specific plane based on the selection signal LS1 during the first time t1 and reading data from the selected plane based on the address signal ADD including the column address information COLUMN. When the first time t1 elapses, the second semiconductor apparatus 420 may transmit the data DOUT and the data strobe signal DQS synchronized with the data DOUT to the first semiconductor apparatus 410 through the data bus 402 and the data strobe bus 404 in FIG. 5. Because the semiconductor system 400 may include no address cycle corresponding to the fourth to sixth cycles C4 to C6 in FIG. 6A, command overhead for the data output operation of the semiconductor system 400 can be reduced by a time corresponding to three address cycles compared to the general semiconductor system.

Another data output operation may be performed in parallel before or when the second semiconductor apparatus 420 transmits the data DOUT to the first semiconductor apparatus 410. For example, before or when the data DOUT is transmitted from the first die to the first semiconductor apparatus 410, in a case in which the first semiconductor apparatus 410 has instructed a data output operation of the first die 421 of the second semiconductor apparatus 420 in the first to fifth cycles C1 to C5, the first semiconductor apparatus 410 may instruct a data output operation of the second die 422 of the second semiconductor apparatus 420. The first semiconductor apparatus 410 may transmit a selection signal LS2 to the second semiconductor apparatus 420 in the sixth cycle C6. For example, the selection signal LS2 may include row address information for selecting a specific plane of the second die. The first semiconductor apparatus 410 may transmit the command signal CMD1S corresponding to the start command signal of the random data output command to the second semiconductor apparatus 420 in a seventh cycle C7, transmit the address signal ADD to the second semiconductor apparatus 420 in eighth and ninth cycles C8 and C9, and transmit the command signal CMD1E corresponding to the end command signal of the random data output command to the second semiconductor apparatus 420 in a tenth cycle C10. The sixth to tenth cycles C6 to C10 may partially or completely overlap a period in which the second semiconductor apparatus 420 transmits the data DOUT to the first semiconductor apparatus 410. When the values of the column address signals of the first and second dies 421 and 422 are independently changed based on the selection signals LS1 and LS2, even though the data input operations of the first and second dies 421 and 422 are performed in parallel, a column address signal of a die that performs a first data input operation might not be contaminated by an address signal provided to a die that performs a second data input operation, and design of internal circuits of the first and second dies 421 and 422 can be simplified.

Figure 7A:
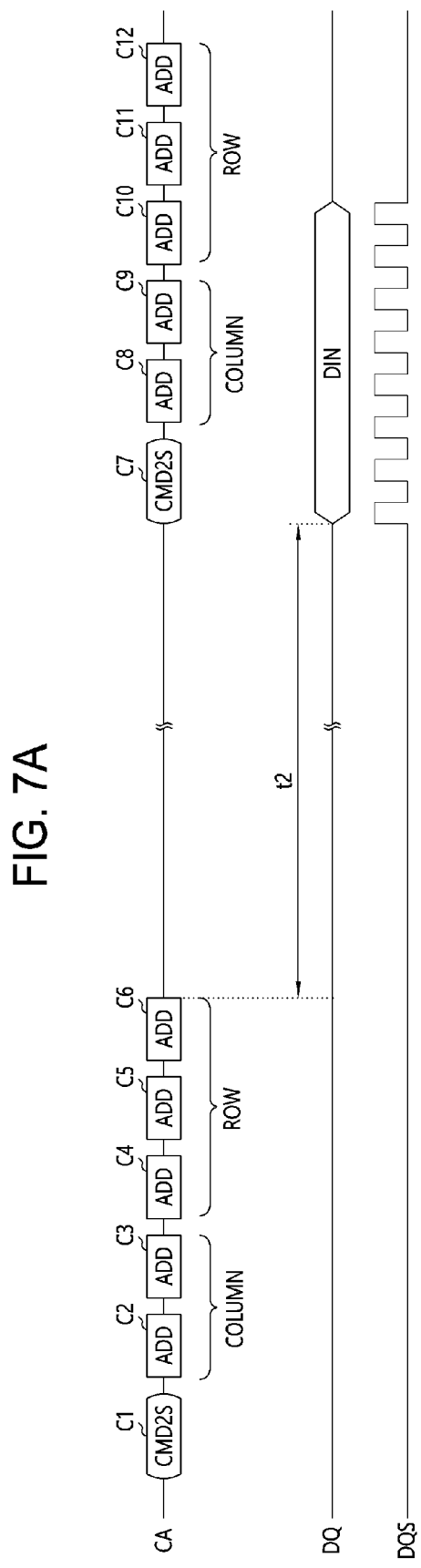
FIG. 7A is a timing diagram illustrating signals transmitted from the general semiconductor system during a data input operation.

FIG. 7A is a timing diagram illustrating signals transmitted in the general semiconductor system during a data input operation. Referring to FIG. 7A, in the general semiconductor system, the first semiconductor apparatus may sequentially provide a command signal CMD2S and an address signal ADD so that the second semiconductor apparatus may perform a data input operation. The first semiconductor apparatus may provide the command signal CMD2S instructing the data input operation to the second semiconductor apparatus in a first cycle C1. The first cycle C1 may be a command cycle. The command signal CMD2S transmitted during the first cycle C1 may be a start command signal of a random data input command. After the command signal CMD2S is provided, the first semiconductor apparatus may provide the address signal ADD to the second semiconductor apparatus in second to sixth cycles C2 to C6. The second to sixth cycles C2 to C6 may be address cycles. In the second and third cycles C2 and C3, the first semiconductor apparatus may transmit the address signal ADD including column address information COLUMN for selecting a string of the second semiconductor apparatus, and in the fourth to sixth cycles C4 to C6, the first semiconductor apparatus may transmit the address signal ADD including row address information ROW for selecting a die and a plane of the second semiconductor apparatus. In the first to sixth cycles C1 to C6, the first semiconductor apparatus may transmit the command signal CMD2S and the address signal ADD to the second semiconductor apparatus through the command address signal CA in FIG. 5. After the address signal ADD is provided, the second semiconductor apparatus may prepare for a data input operation by selecting a specific die and a specific plane based on the address signal ADD during a second time t2. The second time t2 may be tADL of the JEDEC STANDARD. When the second time t2 elapses, the first semiconductor apparatus may transmit data DIN and a data strobe signal DQS synchronized with the data DIN to the second semiconductor apparatus through the data bus 402 and the data strobe bus 404 in FIG. 5.

Another data input operation may be performed in parallel before or when the first semiconductor apparatus transmits the data DIN to the second semiconductor apparatus. For example, before or when the data DIN is transmitted from the first semiconductor apparatus to the first die, in a case in which the first semiconductor apparatus has instructed the data input operation of the first die of the second semiconductor apparatus in the first to sixth cycles C1 to C6 the first semiconductor apparatus may instruct a data input operation of the second die of the second semiconductor apparatus. The first semiconductor apparatus may transmit the command signal CMD2S corresponding to the start command signal of the random data output command to the second semiconductor apparatus in a seventh cycle C7 and may transmit the address signal ADD including the column address information COLUMN and the row address information ROW to the second semiconductor apparatus in eighth to twelfth cycles C8 to C12. The seventh to twelfth cycles C7 to C12 may partially or completely overlap a period in which the second semiconductor apparatus transmits the data DIN to the first semiconductor apparatus. In the general semiconductor system, before or when the data DIN is transmitted to the first die, in a case in which the command signal CMD2S and the address signal ADD are transmitted to the second die, the value of a column address signal of the first die may be changed by the address signal ADD transmitted in the eighth and ninth cycles C8 and C9. Accordingly, when the data input operations of the first and second dies are performed in parallel, each of the first and second dies need to include a complicated internal circuit so that a column address signal of a die that performs a first data input operation is not contaminated by an address signal ADD provided to a die that performs a second data input operation.

Figure 7B:
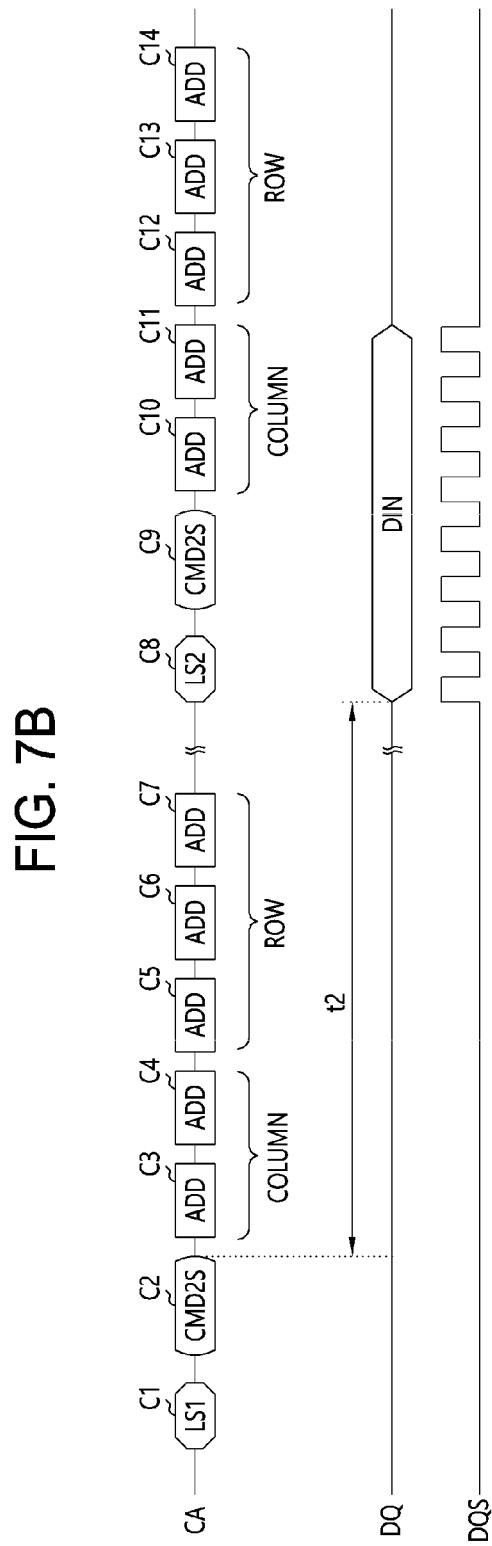
FIG. 7B is a timing diagram illustrating signals transmitted from the semiconductor system in accordance with an embodiment of the present disclosure during a data input operation.

FIG. 7B is a timing diagram illustrating signals transmitted from the semiconductor system 400 in accordance with an embodiment of the present disclosure during a data input operation. Referring to FIG. 5 and FIG. 7B, in the semiconductor system 400, the first semiconductor apparatus 410 may sequentially provide the selection signal LS1, the command signal CMD2S, and the address signal ADD so that the second semiconductor apparatus 420 may perform a data input operation. In a first cycle C1, the selection signal LS1 may be transmitted to the second semiconductor apparatus 420. The first cycle C1 may be a logical unit number (LUN) selection cycle. The selection signal LS1 may include information for selecting a die and/or a plane that performs a data input operation corresponding to a command signal CMD2S transmitted in a command cycle to be described below. The selection signal LS1 may include row address information for selecting a specific die and specific plane of the second semiconductor apparatus 420. For example, the selection signal LS1 may include row address information for selecting a specific plane of the first die 421 of the second semiconductor apparatus 420. After the selection signal LS1 is provided, the first semiconductor apparatus 410 may provide the command signal CMD2S instructing the data input operation to the second semiconductor apparatus 420 in a second cycle C2. The second cycle C2 may be the command cycle. The command signal CMD2S transmitted during the second cycle C2 may be a start command signal of a random data input command. After the command signal CMD2S is provided, the first semiconductor apparatus 410 may provide the address signal ADD to the second semiconductor apparatus 420 in third to seventh cycles C3 to C7. The third to seventh cycles C3 to C7 may be address cycles. Because the first semiconductor apparatus 410 has transmitted the selection signal for selecting a die and a plane of the second semiconductor apparatus 420 in the first cycle C1, the second semiconductor apparatus 420 may prepare for a data input operation by selecting a specific die and a specific plane based on the selection signal LS1 for the second time t2 from the time point at which the command signal CMD2S is received in the second cycle C2. When the second time t2 elapses, the first semiconductor apparatus 410 may transmit data DIN and a data strobe signal DQS synchronized with the data DIN to the second semiconductor apparatus 420 through the data bus 402 and the data strobe bus 404 in FIG. 5. Because the semiconductor system 400 may prepare for the data input operation before the address cycle, command overhead for the data input operation of the semiconductor system 400 can be reduced by a time corresponding to five address cycles compared to the general semiconductor system.

Another data input operation may be performed in parallel before or when the first semiconductor apparatus 410 transmits the data DIN to the second semiconductor apparatus 420. For example, before or when the data DIN is transmitted from the first semiconductor apparatus 410 to the first die 421, in a case in which the first semiconductor apparatus 410 has instructed the data input operation of the first die 421 of the second semiconductor apparatus 420 in the first to seventh cycles C1 to C7, the first semiconductor apparatus 410 may instruct a data input operation of the second die 422 of the second semiconductor apparatus 420. The first semiconductor apparatus 410 may transmit the selection signal LS2 to the second semiconductor apparatus 420 in the eighth cycle C8. For example, the selection signal LS2 may include row address information for selecting a specific plane of the second die 422. The first semiconductor apparatus 410 may transmit the command signal CMD2S corresponding to the start command signal of the random data output command to the second semiconductor apparatus 420 in the ninth cycle C9 and may transmit the address signal ADD to the second semiconductor apparatus 420 in tenth to fourteenth cycles C10 to C14. The eighth to fourteenth cycles C8 to C14 may partially or completely overlap a period in which the first semiconductor apparatus 410 transmits the data DIN to the second semiconductor apparatus 420. When the values of the column address signals of the first and second dies 421 and 422 are independently changed based on the selection signals LS1 and LS2, even though the data input operations of the first and second dies 421 and 422 are performed in parallel, a column address signal of a die that performs a first data input operation might not be contaminated by an address signal provided to a die that performs a second data input operation, and design of internal circuits of the first and second dies 421 and 422 can be simplified.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that all changes or modified forms derived from the meaning and scope of the claims and the equivalent concept thereof are included in the scope of the present disclosure.

What is claimed is:
1. A semiconductor system comprising:
 a first semiconductor apparatus configured to provide a command signal and an address signal, to transmit the command signal during a command cycle, to transmit the address signal during an address cycle, and to transmit a selection signal during a logical unit number (LUN) selection cycle before the command cycle; and a second semiconductor apparatus including a first die and a second die, each of the first and second dies being configured to perform a data input/output operation based on the selection signal, the command signal, and the address signal, wherein each of the first and second dies includes a memory cell array including a plurality of planes, and the selection signal includes information for selecting one of the first and second dies and information for selecting at least one of a plurality of planes of a selected die.

2. The semiconductor system according to claim 1, wherein the selection signal includes information for selecting a die that performs an operation corresponding to the command signal.

3. The semiconductor system according to claim 1, wherein, when the command signal instructs a data output operation of the second semiconductor apparatus, the address signal transmitted by the first semiconductor apparatus during the address cycle includes only column address information.

4. The semiconductor system according to claim 1, wherein, when the command signal instructs a data input operation of the second semiconductor apparatus, the address signal transmitted by the first semiconductor apparatus during the address cycle includes column address information and row address information.

5. The semiconductor system according to claim 1, wherein each of the first and second dies includes a memory cell array including a plurality of planes each including a plurality of blocks and a plurality of page buffers respectively connected to the plurality of planes, and wherein a die selected based on the selection signal activates a plurality of page buffers connected to at least one of the plurality of planes.

6. The semiconductor system according to claim 5, wherein, when the command signal instructs a data output operation of the second semiconductor apparatus, the die selected based on the selection signal reads data stored in the at least one of the plurality of planes based on the address signal.

7. The semiconductor system according to claim 5, wherein, when the command signal instructs a data input operation of the second semiconductor apparatus, the die selected based on the selection signal initializes the plurality of page buffers connected to the at least one of the plurality of planes.

8. An operating method of a semiconductor system, the operating method comprising:

by a first semiconductor apparatus, transmitting a selection signal during a logical unit number (LUN) selection cycle;

by the first semiconductor apparatus, transmitting a command signal instructing a data output operation;

by the first semiconductor apparatus, transmitting an address signal; and by a second semiconductor apparatus, reading data from a memory cell array based on the selection signal and the address signal, wherein the second semiconductor apparatus includes a first die and a second die, each of the first and second dies includes a memory cell array including a plurality of planes, and the selection signal includes information for selecting one of the first and second dies and information for selecting at least one of a plurality of planes of a selected die.

9. The operating method according to claim 8, wherein the address signal includes only column address information.

10. The operating method according to claim 8, further comprising, after the reading data form the memory cell array, by the second semiconductor apparatus, transmitting data to the first semiconductor apparatus.

11. An operating method of a semiconductor system, the operating method comprising:

by a first semiconductor apparatus, transmitting a selection signal during a logical unit number (LUN) selection cycle;

by the first semiconductor apparatus, transmitting a data input command signal;

by a second semiconductor apparatus, initializing a plurality of page buffers based on the selection signal; and by the first semiconductor apparatus, transmitting an address signal.

12. The operating method according to claim 11, wherein the second semiconductor apparatus includes a first die and a second die, and wherein the selection signal includes information for selecting one of the first and second dies.

13. The operating method according to claim 11, wherein the second semiconductor apparatus includes a first die and a second die, each of the first and second dies includes a memory cell array including a plurality of planes each including a plurality of blocks, and wherein the selection signal includes information for selecting one of the first and second dies and information for selecting at least one of a plurality of planes of a selected die.

14. The operating method according to claim 11, wherein the address signal includes row address information and column address information.

15. The operating method according to claim 11, further comprising, after the transmitting the address signal, by the first semiconductor apparatus, transmitting data to the second semiconductor apparatus.

* * * * *